(12) United States Patent
Kim et al.

(10) Patent No.: US 7,732,822 B2
(45) Date of Patent: Jun. 8, 2010

(54) LIGHT EMITTING DEVICE AND METHOD OF MANUFACTURING THE SAME

(75) Inventors: Jong Wook Kim, Gyeonggi-do (KR); Hyun Kyong Cho, Seoul (KR); Jun Ho Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 399 days.

(21) Appl. No.: 11/709,197

(22) Filed: Feb. 22, 2007

(65) Prior Publication Data

US 2007/0200122 A1    Aug. 30, 2007

(30) Foreign Application Priority Data

Feb. 24, 2006    (KR) .................... 10-2006-0018378

(51) Int. Cl.
*H01L 27/15* (2006.01)
(52) U.S. Cl. .................... 257/79; 257/E33.005
(58) Field of Classification Search .................... 257/79, 257/662, E33.005, E33.006
See application file for complete search history.

(56) References Cited

U.S. PATENT DOCUMENTS 5,793,062 A    8/1998  Kish, Jr. et al.
7,023,020 B2 *  4/2006  Uemura .................... 257/94
7,504,667 B2 *  3/2009  Fujikura et al. ............... 257/98
2005/0051781 A1  3/2005  Tu et al.

FOREIGN PATENT DOCUMENTS

| CN | 1564331 A | 1/2005 |
|----|-----------|--------|
| DE | 101 42 541 A1 | 3/2003 |
| JP | 2001-24222 A | 1/2001 |
| JP | 2004-79972 A | 3/2004 |
| KR | 10-2006-0059721 | 6/2006 |
| KR | 10-2006-0060171 | 6/2006 |
| KR | 10-2006-0102446 | 9/2006 |
| KR | 10-0668964 B1 | 1/2007 |
| WO | WO-99/31738 A2 | 6/1999 |
| WO | WO-2005/015647 A1 | 2/2005 |

* cited by examiner

*Primary Examiner*—Mark Prenty
(74) *Attorney, Agent, or Firm*—Birch, Stewart, Kolasch & Birch, LLP

(57) ABSTRACT

A light emitting device having improved light extraction efficiency is disclosed. The light emitting device includes a nitride semiconductor layer including a first semiconductor layer, an active layer, and a second semiconductor layer, which are sequentially stacked, a portion of the first semiconductor layer being exposed to the outside by performing mesa etching from the second semiconductor layer to the portion of the first semiconductor layer, and at least one groove formed through a portion of the first semiconductor layer, the active layer, and the second semiconductor layer.

11 Claims, 11 Drawing Sheets

Laser

LIGHT EMITTING DEVICE AND METHOD OF MANUFACTURING THE SAME

CROSS-REFERENCE TO RELATED APPLICATION

This application claims the benefit of Korean Patent Application No. 10-2006-0018378, filed on Feb. 24, 2006, which is hereby incorporated by reference in its entirety as if fully set forth herein.

BACKGROUND OF THE INVENTION

1. Field of the Invention

The present invention relates to a light emitting device and a method of manufacturing the same, and more particularly, to a light emitting device including one or more grooves formed from a transparent electrode (or an ohmic layer) to a portion of a nitride semiconductor layer, whereby the light efficiency of the light emitting device is improved, and method of manufacturing the same.

2. Discussion of the Related Art

Generally, a light emitting diode (LED) is a kind of semiconductor device that converts electricity into light using the characteristics of a compound semiconductor to transmit and receive a signal or is used as a light source. The light emitting diode generates high-efficiency light at low voltage with the result that the energy saving effect of the light emitting diode is high. Recently, the brightness of the light emitting diode, which was a limit of the light emitting diode, has been considerably improved, and therefore, the light emitting diode has been widely used throughout the whole field of industry, such as backlight units, electric bulletin boards, display units, electric home appliances, and various kinds of automated equipment. Especially, a nitride light emitting diode has attracted considerable attention in the environmentally-friendly aspect because the energy band gap of an active layer constituting the nitride light emitting diode is wide with the result that light emitting spectrum is formed widely from ultraviolet rays to infrared rays, and the nitride light emitting diode does not contain environmentally hazardous materials, such as arsenic (As) and mercury (Hg).

Currently, research is being carried out on a light emitting diode having high brightness that is applicable in various applications. For example, a light emitting diode having high brightness may be obtained by improving the quality of an active layer of the light emitting diode to increase inner quantum efficiency or by assisting light generated from the active layer to be discharged to the outside and collecting the light in a necessary direction to increase light extraction efficiency. Although attempts are being currently made to increase both the inner quantum efficiency and the light extraction efficiency, more active research is being carried out on a method of improving the electrode design, the shape, and the package of the light emitting diode to increase the light extraction efficiency than a method of improving the quality of a semiconductor material to increase the inner quantum efficiency.

The light extraction efficiency is decided by the ratio of electrons injected into the light emitting diode to photons discharged from the light emitting diode. As the light extraction efficiency is increased, the brightness of the light emitting diode is increased. The light extraction efficiency of the light emitting diode is greatly affected by the shape or the surface state of a chip, the structure of the chip, and the package form of the chip. Consequently, it is necessary to pay careful attention when designing the light emitting diode. For a light emitting diode with high output and high brightness, the light extraction efficiency acts as an important factor to decide the light emission efficiency of the light emitting diode. In a conventional method of manufacturing a nitride light emitting diode, however, the light extraction efficiency is limited.

In the conventional nitride light emitting diode, a total reflection condition occurs due to the difference in a refractive index between a nitride semiconductor material and the outside when light generated from an active layer is discharged to the outside. As a result, light incident at an angle more than the critical angle of the total reflection is not discharged to the outside but is reflected into the light emitting diode. Specifically, as shown in FIG. 1, when light generated from an active layer 30 reaches the surface of a nitride semiconductor material 40, the light is not discharged to the outside but is reflected into the light emitting diode if the incident angle of the incident light exceeds the critical angle $\theta_c$, which is decided by the outer refractive index and the refractive index of the nitride semiconductor material. The reflected light is diminished as the light passes through several channels.

The critical angle is decided by Snell's Law. Specifically, the critical angle may be obtained by Equation 1 below.

$$\sin \theta_c = N_1/N_2 \qquad \text{[Equation 1]}$$

Where, $\theta_c$ is the critical angle, $N_1$ is the outer refractive index of the light emitting diode, and $N_2$ is the inner refractive index of the light emitting diode.

The light emitting diode is driven as follows: when voltage is applied to a p-electrode and an n-electrode, holes and electrons move from a p-type nitride semiconductor layer and an n-type nitride semiconductor layer to an active layer. The electrons and the holes are recoupled with each other in the active layer, whereby light is generated from the active layer. The light generated from the active layer advances upward and downward from the active layer. The upward-advancing light is discharged to the outside through a transparent electrode thinly formed on the p-type nitride semiconductor layer. The downward-advancing light is discharged to the outside through a substrate, and is then absorbed into solder used when packaging the light emitting diode, or else, the downward-advancing light is reflected by the substrate, moves upward, and is then reabsorbed into the active layer, or is discharged to the outside through the transparent electrode.

The size of the light generated from the active layer of the light emitting diode is decreased due to absorption and dispersion during the advance of the light in the interior of the light emitting diode. Specifically, the light generated from the active layer of the light emitting diode and to be discharged to the outside through the side of the light emitting diode moves a longer distance than the light to be discharged to the outside through the top of the light emitting diode. For this reason, the size of the light to be discharged to the outside through the side of the light emitting diode is decreased due to the absorption and the dispersion. As described above, the light generated from the active layer of the light emitting diode is totally reflected into the light emitting diode or is absorbed or dispersed during the advance of the light in the interior of the light emitting diode, and therefore, the size of the light is decreased. As a result, the light extraction efficiency of the light emitting diode is lowered.

SUMMARY OF THE INVENTION

Accordingly, the present invention is directed to a light emitting device and a method of manufacturing the same that substantially obviate one or more problems due to limitations and disadvantages of the related art.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device includes a nitride semiconductor layer including a first semiconductor layer, an active layer, and a second semiconductor layer, which are sequentially stacked, a portion of the first semiconductor layer being exposed to the outside by performing mesa etching from the second semiconductor layer to the portion of the first semiconductor layer, and at least one groove formed through a portion of the first semiconductor layer, the active layer, and the second semiconductor layer.

In another aspect of the present invention, a light emitting device includes a nitride semiconductor layer including a first semiconductor layer, an active layer, and a second semiconductor layer, which are sequentially formed, an ohmic layer and a conductive support film sequentially formed on the second semiconductor layer, and at least one groove formed through a portion of the first semiconductor layer, the active layer, the second semiconductor layer, and the ohmic layer.

In another aspect of the present invention, a method of manufacturing a light emitting device includes sequentially forming a buffer layer, a nitride semiconductor layer including a first semiconductor layer, an active layer, and a second semiconductor layer, and a transparent electrode on a substrate, performing mesh etching from the transparent electrode to a portion of the first semiconductor layer to expose the portion of the first semiconductor layer to the outside, and performing etching from the transparent electrode to a portion of the first semiconductor layer to form at least one groove.

In a further aspect of the present invention, a method of manufacturing a light emitting device includes sequentially forming a nitride semiconductor layer including a first semiconductor layer, an active layer, and a second semiconductor layer, and an ohmic layer on a substrate, and forming at least one groove through the ohmic layer, the second semiconductor layer, the active layer, and a portion of the first semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The present invention is characterized by performing an etching process from a transparent electrode (or an ohmic layer) to a portion of an n-type semiconductor layer so as to form one or more grooves spaced apart from each other. Consequently, light generated from an active layer is absorbed and dispersed in a light emitting device such that the light can be discharged to the outside before the size of light is reduced to a specific level, whereby the light extraction efficiency of the light emitting device is improved.

Figure 1:
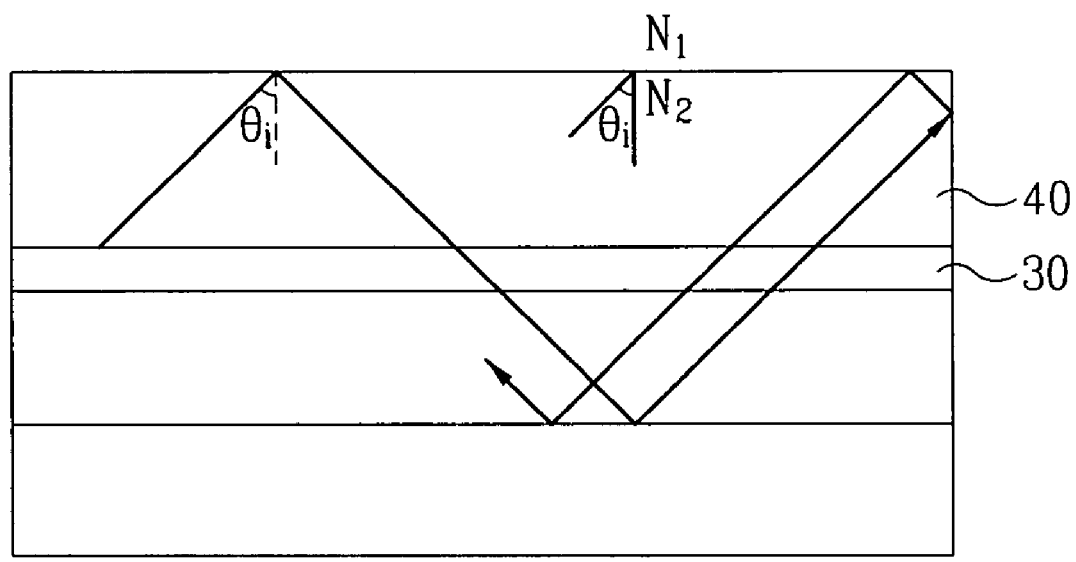
FIG. 1 is a view illustrating a principle in which light generated from an active layer of a conventional light emitting device is totally reflected from a nitride semiconductor surface.
Figure 2:
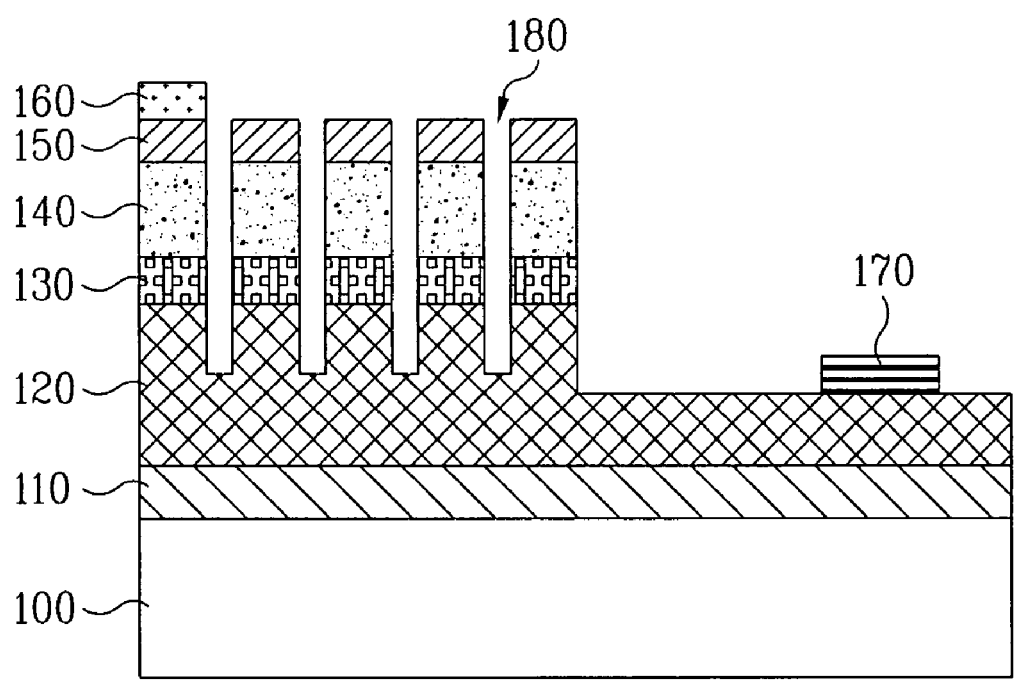
FIG. 2 is a sectional view illustrating an embodiment of light emitting device according to the present invention.

FIG. 2 is a sectional view illustrating an embodiment of light emitting device according to the present invention. Hereinafter, an embodiment of light emitting device according to the present invention will be described in detail with reference to FIG. 2.

The light emitting device according to this embodiment is constructed in a structure in which a buffer layer 110, an n-type nitride semiconductor layer 120, an active layer 130, and a p-type nitride semiconductor layer 140 are sequentially formed on a substrate 100. Mesa etching is carried out from the p-type nitride semiconductor layer 140 to a portion of the n-type nitride semiconductor layer 120 using a reactive ion etching (RIE) method. As a result, the etched portion of the n-type nitride semiconductor layer 120 is exposed to the upside. On the p-type nitride semiconductor layer 140 is formed a transparent electrode 150. A plurality of grooves 180 are formed from the transparent electrode 150 to a portion of the n-type nitride semiconductor layer 120 while the grooves are spaced apart from each other. On the transparent electrode 150 is formed a p-electrode 160. On the exposed portion of the n-type nitride semiconductor layer 120 is formed an n-electrode 170.

The substrate 100 may be a sapphire ($Al_2O_3$) substrate, a silicon carbide (SiC) substrate, a silicon (Si) substrate, or a gallium arsenide (GaAs) substrate. Among them, the sapphire substrate is preferably used as the subtracted 100 according to the present invention. The buffer layer 110 serves to eliminate the lattice mismatch between the substrate 100 and a nitride semiconductor material and the difference in a coefficient of thermal expansion between the substrate 100 and the nitride semiconductor material. A GaN or AlN low-temperature growth layer is used as the buffer layer 110. The n-type nitride semiconductor layer 120 is made of an n-doped semiconductor material satisfying the following formula: $Al_xIn_yGa_{(1-x-y)}N$ (where, $0 \leq x \leq 1$, $0 \leq y \leq 1$, and $0 \leq x+y \leq 1$). Preferably, the n-type nitride semiconductor layer 120 is made of n-GaN. The active layer 130 has a multi-quantum well (MQW) structure. The active layer 130 may be made of GaN or InGaN. Also, the p-type nitride semiconductor layer 140 is made of a nitride semiconductor material satisfying the following formula: $Al_xIn_yGa_{(1-x-y)}N$ (where, $0 \leq x \leq 1$, $0 \leq y \leq 1$, and $0 \leq x+y \leq 1$), like the n-type nitride semiconductor layer 120. The nitride semiconductor material is p-doped.

The p-type nitride semiconductor layer 140 has low dopant concentration. As a result, the contact resistance of the p-type nitride semiconductor layer 140 is high, and therefore, the p-type nitride semiconductor layer 140 has a poor ohmic characteristic. In order to the ohmic characteristic of the p-type nitride semiconductor layer 140, therefore, the transparent electrode 150 is formed on the p-type nitride semiconductor layer 140. A transparent electrode layer constructed in a dual-layered structure including nickel (Ni) and gold (Au) is preferably used as the transparent electrode 150. The transparent electrode layer constructed in the dual-layered structure including nickel (Ni) and gold (Au) forms an ohmic contact with the p-type nitride semiconductor layer 140, while increasing the current injection area, to decrease forward voltage $V_f$. On the other hand, a transparent conducting oxide (TCO) layer exhibiting a high transmissivity, i.e., a transmissivity of approximately 90% or more, may be formed on the p-type nitride semiconductor layer 140, instead of the dual layer including nickel (Ni) and gold (Au) exhibiting low transmissivity, i.e., a transmissivity of approximately 60% to 70%. The p-electrode 160 and the n-electrode 170 may be made of any one selected from a group consisting of chrome (Cr), nickel (Ni), gold (Au), aluminum (Al), titanium (Ti), and platinum (Pt), or an alloy thereof.

The light emitting device according to the present invention is characterized in that the grooves 180 are formed from the transparent electrode 150 to the n-type nitride semiconductor layer 120, whereby the light extraction efficiency of the light emitting device is improved. One or more grooves 180 may be formed, and the grooves 180 may be formed by performing an etching process from the transparent electrode 150 to a portion of the n-type nitride semiconductor layer 120. By the provision of the grooves 180 formed by performing the etching process from the transparent electrode 150 to the portion of the n-type nitride semiconductor layer 120, it is possible to reduce the distance in which light generated from the active layer 130 advances in the interior of the light emitting device and thus to the amount of light absorbed and dispersed in the light emitting device.

In a conventional light emitting diode, light generated from the active layer is absorbed and dispersed in a material layer of the light emitting diode while the light advances in the interior of the light emitting diode with the result that the intensity of the light is decreased. Especially in the case of light escaping through the side of the light emitting diode, the distance in which the light advances in the interior of the light emitting diode is large, and therefore, a large amount of the light is absorbed and dispersed in the material layer of the light emitting diode, whereby the intensity of the light is further decreased.

In the light emitting diode, the intensity of light generated from the active layer is reduced with the increase of the distance in which the light advances in the interior of the light emitting diode. This may be expressed by Equation 2 below.

$$I=I_0\{\exp(-\alpha L)\} \quad \text{[Equation 2]}$$

Where, I is the intensity of the light after the light advances a distance L, $I_0$ is the initial intensity of the light, and $\alpha$ is the absorption coefficient of the material. According to Equation 2, the intensity of the light generated from the active layer is exponential-functionally decreased with the increase of the distance in which the light advances in the interior of the light emitting diode and the increase of the absorption coefficient $\alpha$. However, it is difficult to change the material for light emitting diode. Alternatively, therefore, the distance in which the light advances in the interior of the light emitting diode may be reduced to prevent the reduction in the intensity of the light.

According to the present invention, etching is carried out from the transparent electrode 150 to a portion of the n-type nitride semiconductor layer 120 so as to form the plurality of grooves 180 which are spaced apart from each other, and therefore, the light generated from the active layer 130 advances only a short distance and is then discharged to the outside. In this embodiment, it is possible to reduce the amount of light absorbed and dispersed in the light emitting diode after the light is generated from the active layer 130, thereby increasing the intensity of the light discharged to the outside.

Preferably, the distance between the grooves 180 is set such that $I/I_0$ is 0.5 or more, and the respective grooves 180 have a width of approximately 1 to 10 µm. When the distance between the grooves 180 is set such that $I/I_0$ is 0.5 or more as described above, the light generated from the active layer escapes out of the light emitting diode before the intensity of the light is reduced to half the initial intensity of the light. Consequently, it is possible to prevent the intensity of the light generated from the active layer 130 from being reduced to a specific level due to the absorption and dispersion of the light in the light emitting diode.

When the grooves 180 are formed such that the inside surfaces of the respective grooves 180 are at a specific angle to a line perpendicular to the substrate 100, the light extraction efficiency of the light emitting diode is further improved. Specifically, when the grooves 180 are formed such that the inside surfaces of the respective grooves 180 are at the specific angle to the perpendicular line, the critical angle at the inside surfaces of the grooves 180 is increased, and, when the light generated from the active layer 130 reaches the inside surfaces of the respective grooves 180, a probability that the light will be totally reflected to the interior of the light emitting diode is decreased. For example, the grooves 180 may be formed such that the inside surfaces of the respective grooves 180 are at an angle of 0 to 70 degrees to the perpendicular line. Here, the perpendicular line is an imaginary line perpendicular to the interfaces between the n-type nitride semiconductor layer 120, the active layer 130, and the p-type nitride semiconductor layer 140, which constitute a nitride semiconductor layer.

FIGS. 3A to 3E are sectional views illustrating an embodiment of light emitting device manufacturing method according to the present invention. Hereinafter, an embodiment of light emitting device manufacturing method according to the present invention will be described in detail with reference to FIGS. 3A to 3E.

Figure 3A:
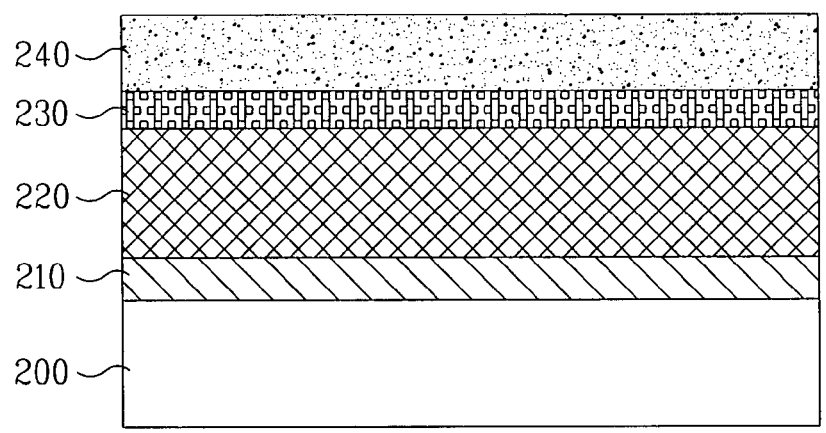
FIGS. 3A to 3E are sectional views illustrating an embodiment of light emitting device manufacturing method according to the present invention.

This embodiment is a method of manufacturing a light emitting device as shown in FIG. 2. First, as shown in FIG. 3A, a buffer layer 210, an n-type nitride semiconductor layer 220, an active layer 230, and a p-type nitride semiconductor layer 240 are sequentially formed on a substrate 200. A sapphire ($Al_2O_3$) substrate, a silicon carbide (SiC) substrate, a silicon (Si) substrate, or a gallium arsenide (GaAs) substrate may be used as the substrate 200. The buffer layer 210, the n-type nitride semiconductor layer 220, the active layer 230, and the p-type nitride semiconductor layer 240 formed on the substrate 200 may be grown using vapor deposition, such as metal organic chemical vapor deposition (MOCVD), molecular beam epitaxy (MBE), or hydride vapor phase epitaxy (HVPE).

Figure 3B:
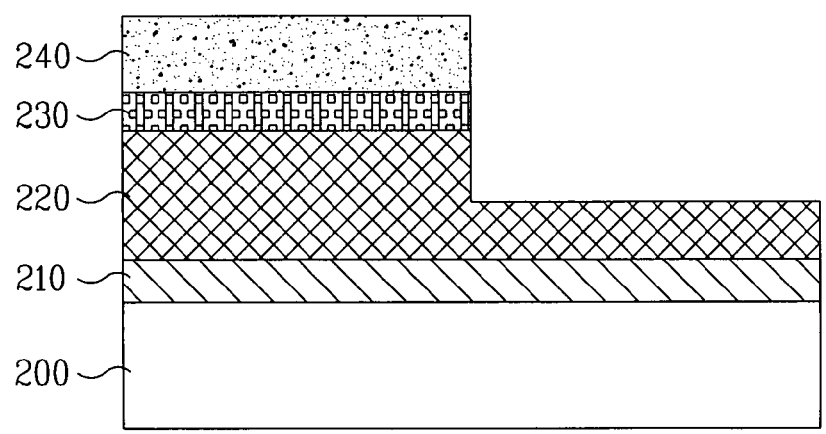

Subsequently, as shown in FIG. 3B, mesa etching is carried out from the p-type nitride semiconductor layer 240 to a portion of the n-type nitride semiconductor layer 220 such that the etched portion of the n-type nitride semiconductor layer 220 is exposed to the outside. Specifically, when an insulative substrate, such as the sapphire substrate, is used as the substrate 200, it is not possible to form electrodes at the bottom of the substrate 200. Consequently, the mesa etching is carried out from the p-type nitride semiconductor layer 240 to a portion of the n-type nitride semiconductor layer 220 so as to secure a space necessary to form the electrodes.

Figure 3C:
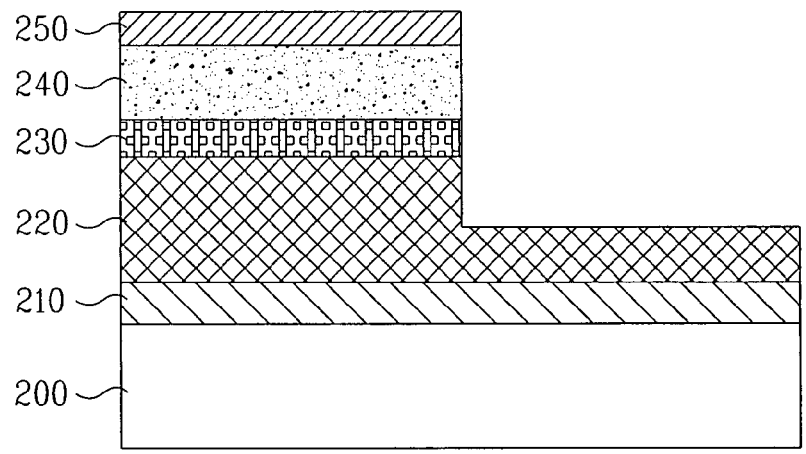

Subsequently, as shown in FIG. 3C, a transparent electrode 250 is formed on the p-type nitride semiconductor layer 240. The transparent electrode 250 forms an ohmic contact with the p-type nitride semiconductor layer 240, while increasing the current injection area, to decrease forward voltage $V_f$. A dual layer including nickel (Ni) and gold (Au) may be used as the transparent electrode 250. Alternatively, a transparent conducting oxide (TCO) layer, such as an indium tin oxide (ITO) layer or a zinc oxide (ZnO) layer, may be used as the transparent electrode 250.

Figure 3D:
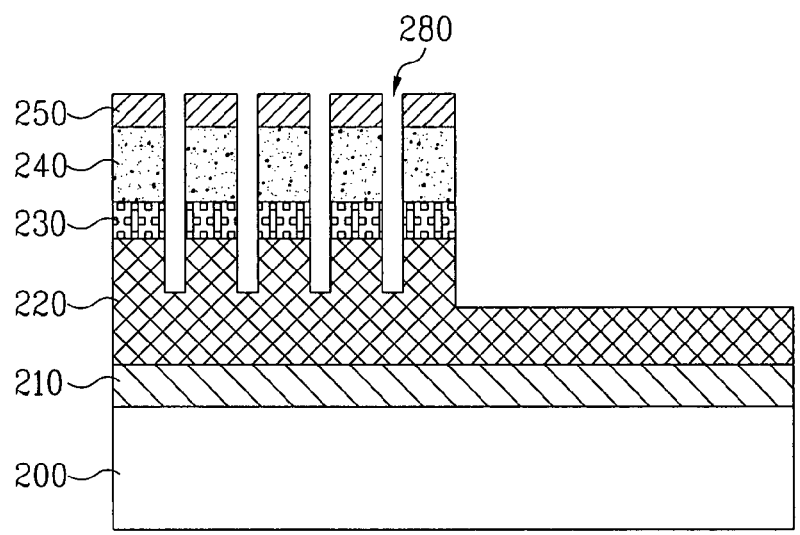

Subsequently, as shown in FIG. 3D, etching is performed from the transparent electrode 250 to a portion of the n-type nitride semiconductor layer 220 so as to form one or more grooves 280. When the number of the grooves is two or more, the grooves may be spaced apart from each other. Specifically, photo resist is applied and patterned on the transparent electrode 250, etching is performed from the transparent electrode 250 to a portion of the n-type nitride semiconductor layer 220 with the patterned photo resist being used as an etching mask. The etching may be performed in a dry etching fashion using an inductively coupled plasma/reactive ion etching (ICP/RIE) method. The grooves 280 may be formed such that the respective grooves 280 have a width of approximately 1 to 10 μm.

In addition, the grooves 280 may be formed such that the inside surfaces of the respective grooves are at an angle of 0 to 70 degrees to a line perpendicular to the substrate 200. The inclination of the inside surfaces of the grooves 280 may be adjusted by bias or density of plasma or photo resist. Specifically, the temperature of the patterned photo resist may be adjusted such that the photo resist has a specific inclination at the side surface thereof. When the patterned photo resist is used as the etching mask, it is possible to adjust the angle of the grooves at the inside surfaces thereof. Also, when the bias or density of plasma is changed, it is possible to adjust the orientation of the plasma. Consequently, it is possible to adjust the angle of the grooves at the inside surfaces thereof.

Figure 3E:
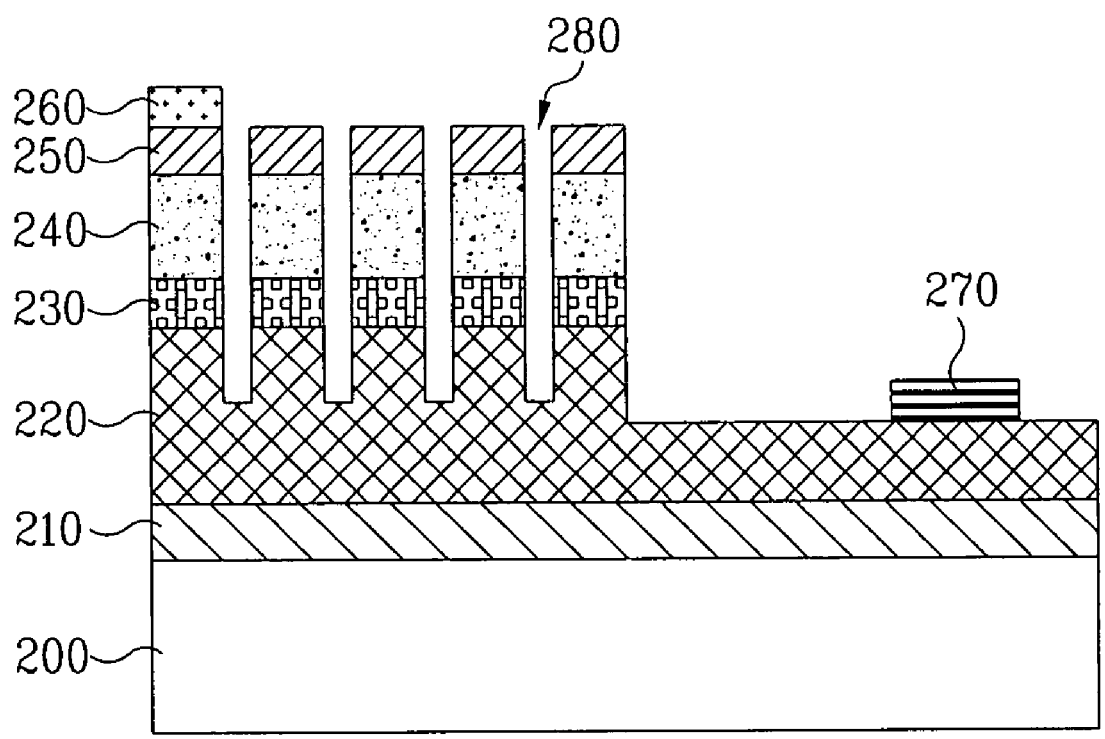

Subsequently, as shown in FIG. 3E, a p-electrode 260 is formed on the transparent electrode 250. The p-electrode 260 may be formed on the edge of the transparent electrode 250. An n-electrode 270 is formed on the exposed portion of the n-type nitride semiconductor layer 220.

Figure 4A:
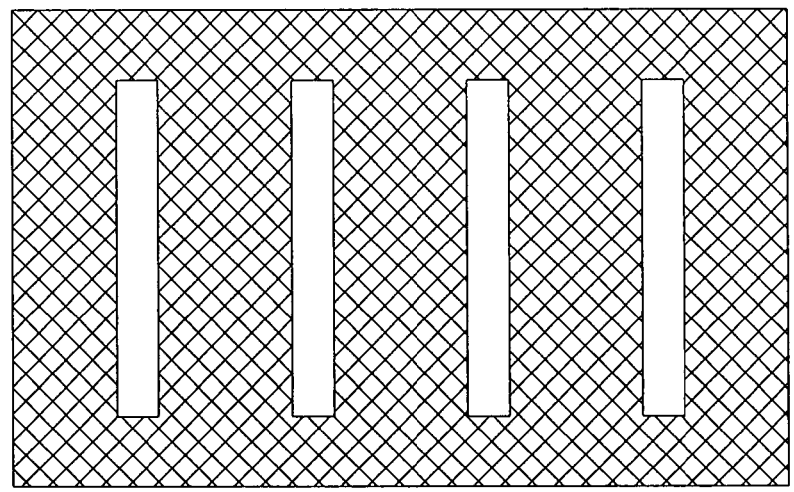
FIGS. 4A to 4C are plan views illustrating the shapes of a plurality of grooves according to the present invention.
Figure 4B:
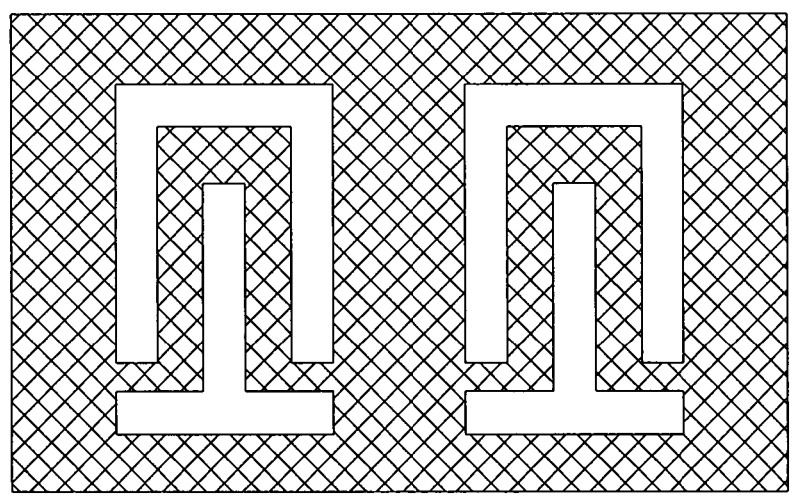
Figure 4C:
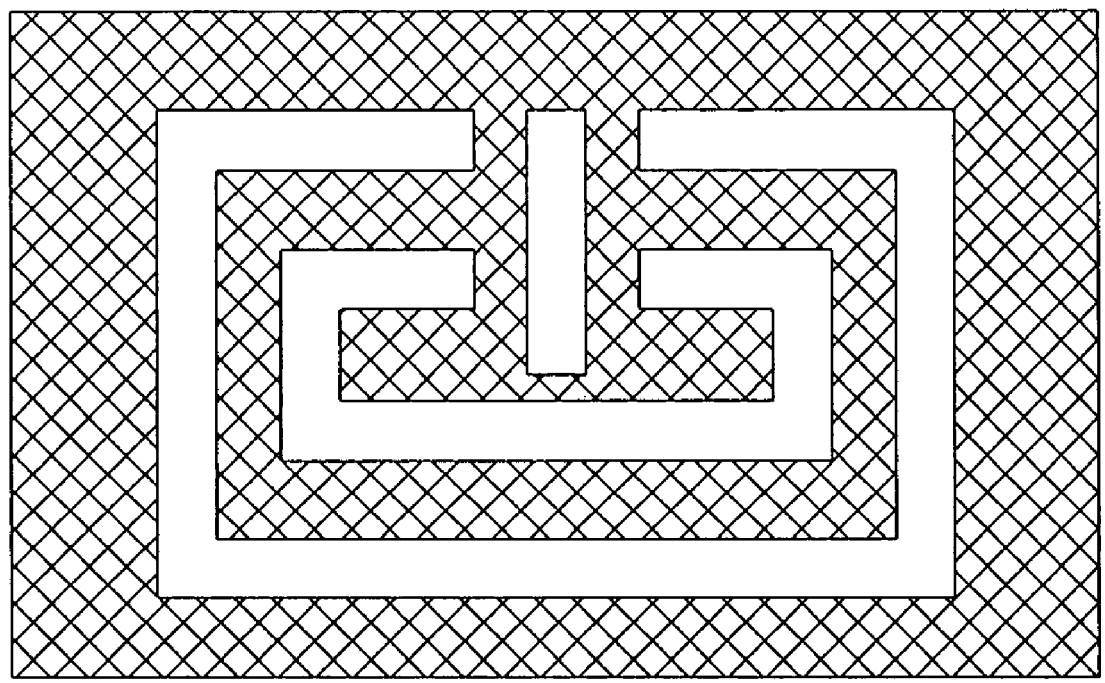

FIGS. 4A to 4C are plan views illustrating the shapes of a plurality of grooves according to the present invention. As shown in FIGS. 4A to 4C, it is possible to form one or more grooves in various shapes. However, it is also possible to form the grooves in other shapes. The grooves may have a width of 1 to 10 μm as described above. When the grooves are inclined at a specific angle as described above, the grooves may have shapes different from those illustrated in the plan views. Referring first to FIG. 4A, a plurality of grooves are formed in the shape of a stripe, and the grooves are spaced a predetermined distance from each other. Referring to FIGS. 4B and 4C, a plurality of grooves are formed such that the grooves are bent into predetermined shapes. Specifically, FIGS. 4A to 4C are plan views illustrating the transparent electrode of the light emitting device. Consequently, it should be noted that the grooves are formed from the transparent electrode to a portion of the n-type nitride semiconductor layer, although only the transparent electrode and the grooves are shown in FIGS. 4A to 4C. In addition, it should be noted that the respective layers are not cut by the grooves, and therefore, each of the layers constitutes a single layer, although the plurality of grooves are formed in the transparent electrode, the p-type nitride semiconductor layer, the active layer, and the n-type nitride semiconductor layer. Preferably, the grooves are arranged uniformly over the entire area of each layer as shown in FIGS. 4A to 4C.

The light emitting device and the method of manufacturing the same as described above are related to a horizontal electrode type light emitting diode constructed in a structure in which a p-electrode and an n-electrode are formed on the same plane. Hereinafter, a vertical electrode type light emitting diode, i.e., another embodiment of light emitting device constructed in a structure in which a p-electrode (conductive support film) is formed at the top of a light emitting structure, and an n-electrode is formed at the bottom of the light emitting structure.

Figure 5:
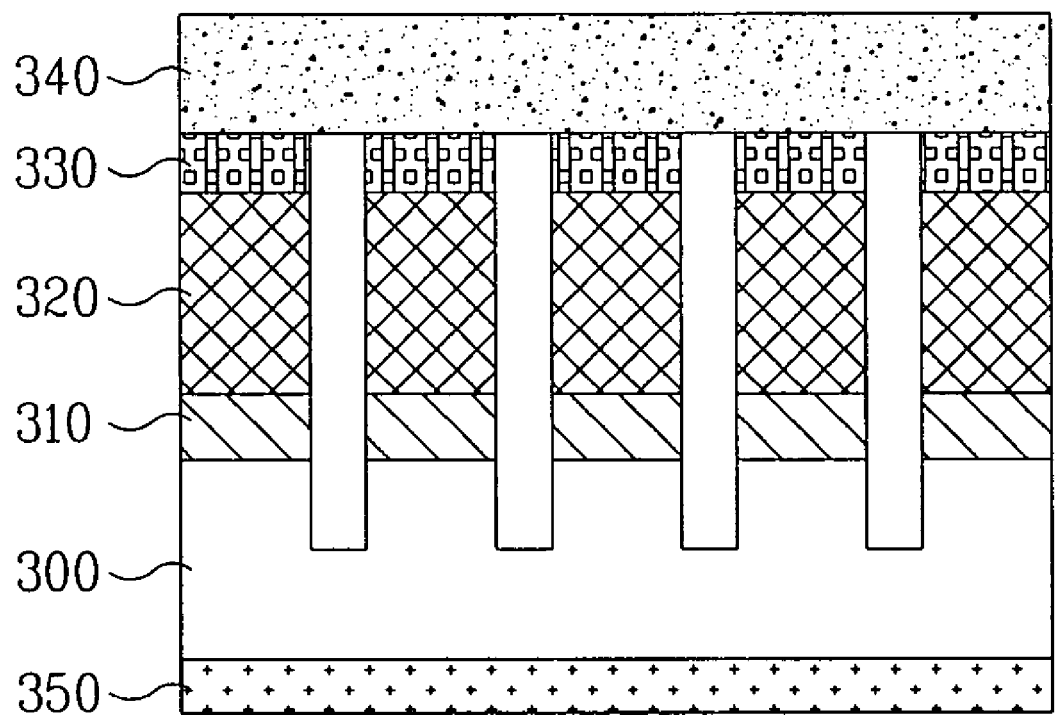
FIG. 5 is a sectional view illustrating another embodiment of light emitting device according to the present invention.

FIG. 5 is a sectional view illustrating another embodiment of light emitting device according to the present invention. Hereinafter, another embodiment of light emitting device according to the present invention will be described in detail with reference to FIG. 5.

The light emitting device according to this embodiment is constructed by sequentially forming an n-type nitride semiconductor layer 300, an active layer 310, a p-type nitride semiconductor layer 320, and an ohmic layer 330. Also, one or more grooves are formed from the ohmic layer 330 to a portion of the n-type nitride semiconductor layer 300. When the number of the grooves is two or more, the grooves may be spaced apart from each other. In addition, a conductive support film is formed on the ohmic layer 330, and an n-electrode 350 is formed on the n-type nitride semiconductor layer 300.

The ohmic layer 330 is made of a thin metal film including nickel (Ni) and gold (Au). The metal film mainly including nickel (Ni) is heat-treated at an oxygen atmosphere to form an ohmic contact having a specific contact resistance of approximately $10^{-3}$ to $10^{-4}$ $\Omega cm^2$. When the thin metal film including nickel (Ni) and gold (Au) is used as the ohmic layer 330, the reflexibility of the ohmic layer 330 is highly increased, and therefore, it is possible for the ohmic layer 330 to effectively reflect light emitted from the active layer 310. Consequently, it is possible to obtain a reflecting effect without the formation of an addition reflector.

The conductive support film 340 serves as a p-electrode. Consequently, it is preferable to form the conductive support film 340 using metal having high electrical conductivity. In addition, it is required for the conductive support film 340 to sufficiently diffuse heat generated during the operation of the light emitting device. Consequently, it is preferable to form the conductive support film 340 using metal having high thermal conductivity. Furthermore, in order to separate a wafer into a plurality of individual chips through a scribing process and a breaking process while the entire wafer is not bent during the formation of the conductive support film 340, it is required for the conductive support film 340 to have mechanical strength to some extent. Consequently, it is possible to form the conductive support film 340 using an alloy of soft metal having high thermal conductivity, such as gold (Au), copper (Cu), silver (Ag), and aluminum (Al) and hard metal which has a crystal structure and a crystal lattice constant similar to those of the above-specified soft metal to minimize the occurrence of internal stress when the alloy is made and has high mechanical strength, such as nickel (Ni), cobalt (Co), platinum (Pt), and palladium (Pd).

FIGS. 6A to 6E are sectional views illustrating another embodiment of light emitting device manufacturing method according to the present invention. Hereinafter, another embodiment of light emitting device manufacturing method according to the present invention will be described in detail with reference to FIGS. 6A to 6E.

Figure 6A:
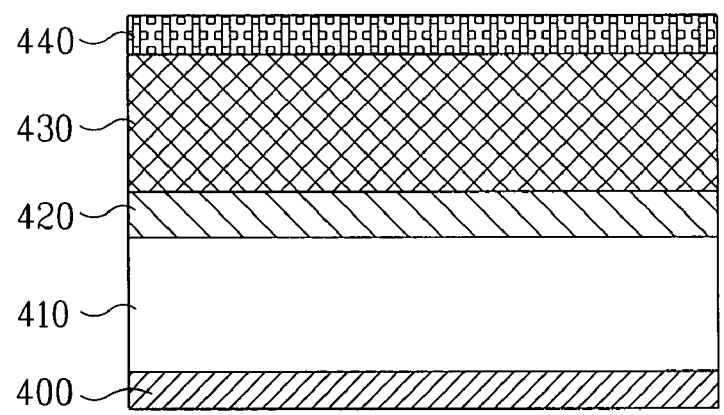
FIGS. 6A to 6E are sectional views illustrating another embodiment of light emitting device manufacturing method according to the present invention.
Figure 6B:
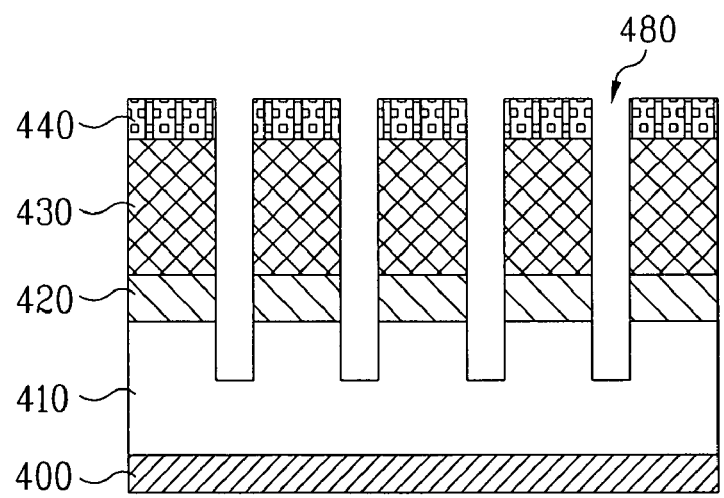

This embodiment is a method of manufacturing a light emitting device as shown in FIG. 5. First, as shown in FIG. 6A, an n-type nitride semiconductor layer 410, an active layer 420, a p-type nitride semiconductor layer 430, and an ohmic layer 440 are sequentially formed on a sapphire substrate 400.

Figure 6C:
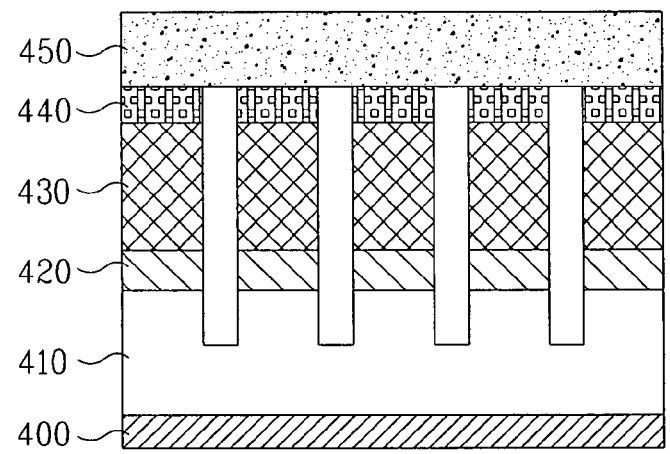

Subsequently, etching is carried out from the ohmic layer 440 to a portion of the n-type nitride semiconductor layer 410 so as to form one or more grooves 480 (FIG. 6B) After that, as shown in FIG. 6C, a conductive support film 450 is formed on the ohmic layer 440.

Figure 6D:
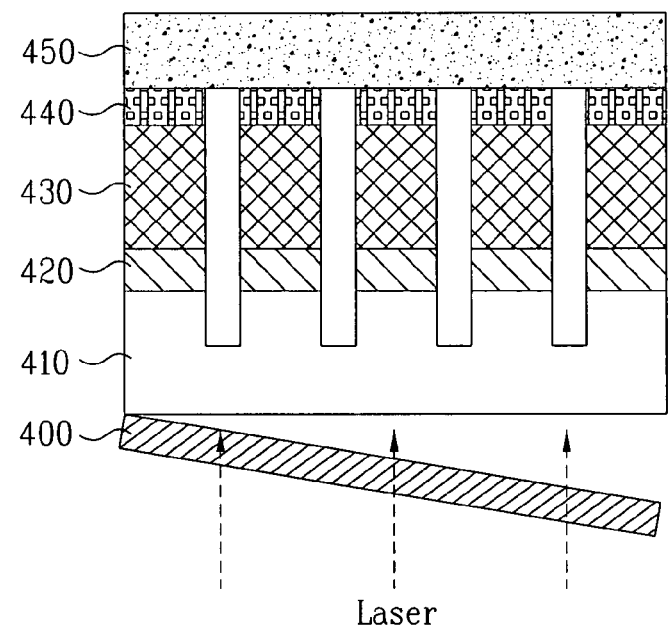

Subsequently, as shown in FIG. 6D, the sapphire substrate 400 is removed from the n-type nitride semiconductor layer 410. The removal of the sapphire substrate 400 may be carried out by a laser lift off (LLO) method using excimer laser or a dry-type and wet-type etching method. Preferably, the removal of the sapphire substrate 400 is carried out by the laser lift off (LLO) method. Specifically, when excimer laser light having a specific wavelength range is focused and irradiated on the sapphire substrate 400, thermal energy is concentrated on the interface between the sapphire substrate 400 and the n-type nitride semiconductor layer 410. As a result, gallium and nitrogen molecules are separated from each other at the surface of the n-type nitride semiconductor layer 410, and therefore, the sapphire substrate 400 is instantaneously separated from the n-type nitride semiconductor layer 410 at the position where the laser light is transmitted.

Figure 6E:
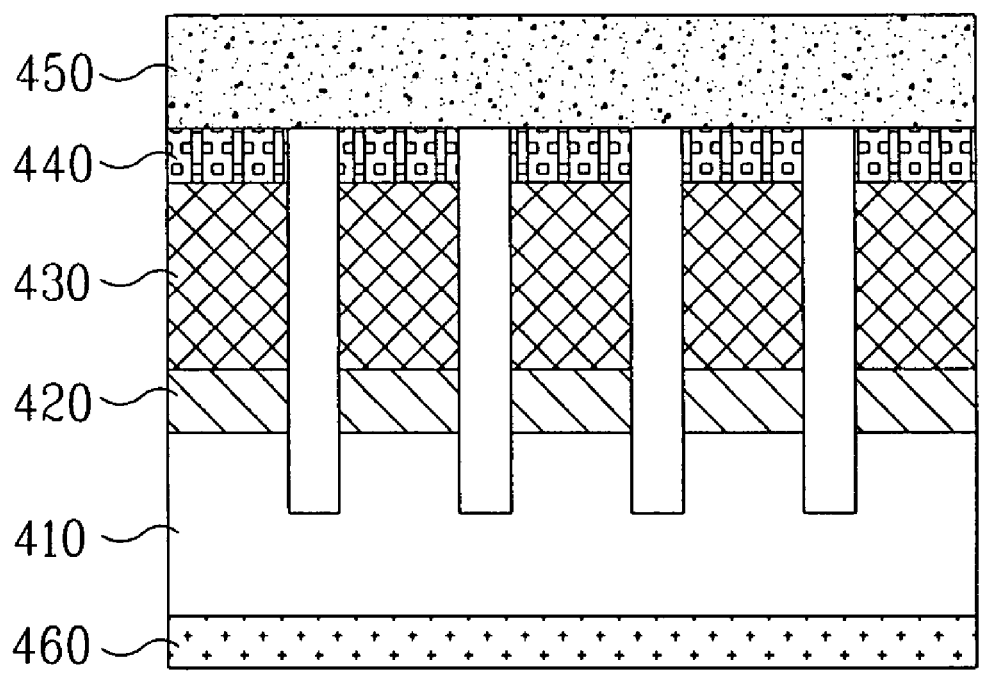

Subsequently, as shown in FIG. 6E, an n-electrode 460 is formed on the n-type nitride semiconductor layer 410.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device comprising:
   a nitride semiconductor layer including a first semiconductor layer, an active layer, and a second semiconductor layer, which are sequentially stacked; and
   at least one groove formed through a portion of the first semiconductor layer, the active layer, and the second semiconductor layer,
   wherein the portion of the first semiconductor layer, the active layer, and the second semiconductor layer are exposed to the outside by the at least one groove, and
   wherein the at least one groove includes a plurality of grooves, the grooves being spaced apart from each other such that $I/I_0$ is 0.5 or more (where, I is the intensity of light after the light advances a distance L; $I=I_0\{\exp(-\alpha L)\}$, $I_0$ is the initial intensity of the light, and $\alpha$ is the absorption coefficient of the nitride semiconductor layer).

2. The light emitting device according to claim 1, wherein the at least one groove has a width of 1 to 10 μm.

3. The light emitting device according to claim 1, wherein the at least one groove is inclined at an angle of 0 to 70 degrees to a line perpendicular to the nitride semiconductor layer.

4. The light emitting device according to claim 1, wherein the at least one groove is formed in the shape of a stripe.

5. The light emitting device according to claim 1, further comprising:
   a transparent electrode and a second electrode sequentially formed on the second semiconductor layer, wherein
   the at least one groove is formed through the transparent electrode.

6. The light emitting device according to claim 5, wherein the transparent electrode is formed of a dual layer including nickel (Ni) and gold (Au) or a transparent conducting oxide (TCO) layer.

7. The light emitting device according to claim 1, further comprising a first electrode formed on an exposed portion of the first semiconductor layer.

8. A light emitting device comprising:
   a conductive support film;
   an ohmic layer on the conductive support film;
   a semiconductor layer including a first semiconductor layer, an active layer, and a second semiconductor layer;
   an electrode on the semiconductor layer; and
   at least one groove formed through at least a portion of the first semiconductor layer or the second semiconductor layer, and through the active layer,
   wherein the conductive support film and the electrode are located at opposite sides of the semiconductor layer, respectively, and
   wherein the conductive support film covers the at least one groove.

9. The light emitting device according to claim 8, wherein the at least one groove includes a plurality of grooves, the grooves being spaced apart from each other such that $I/I_0$ is 0.5 or more (where, I is the intensity of light after the light advances a distance L; $I=I_0\{\exp(-\alpha L)\}$, $I_0$ is the initial intensity of the light, and $\alpha$ is the absorption coefficient of the semiconductor layer).

10. The light emitting device according to claim 8, wherein the at least one groove has a width of 1 to 10 μm.

11. The light emitting device according to claim 8, wherein the at least one groove is inclined at an angle of 0 to 70 degrees to a line perpendicular to the semiconductor layer.

* * * * *

UNITED STATES PATENT AND TRADEMARK OFFICE
CERTIFICATE OF CORRECTION

| | | |
|---|---|---|
| PATENT NO. | : 7,732,822 B2 | Page 1 of 1 |
| APPLICATION NO. | : 11/709197 | |
| DATED | : June 8, 2010 | |
| INVENTOR(S) | : Jong Wook Kim et al | |

It is certified that error appears in the above-identified patent and that said Letters Patent is hereby corrected as shown below:

Title Page, Item (73), please correct the Assignees as follow:

(73) Assignees: LG Electronics Inc., Seoul (KR);
LG Innotek Co., Ltd., Seoul (KR)

Signed and Sealed this
Thirty-first Day of May, 2011

David J. Kappos
*Director of the United States Patent and Trademark Office*